United States Patent
Lee et al.

(10) Patent No.: US 9,438,216 B2
(45) Date of Patent: Sep. 6, 2016

(54) COMPENSATION TIME COMPUTING METHOD AND DEVICE FOR CLOCK DIFFERENCE

(71) Applicants: APEX MATERIAL TECHNOLOGY CORP., Keelung (TW); IMAGINATION BROADWAY LTD., New Taipei (TW)

(72) Inventors: Shang-Li Lee, Keelung (TW); Zong-Bin Liao, Keelung (TW)

(73) Assignees: APEX MATERIAL TECHNOLOGY CORP., Keelung (TW); IMAGINATION BROADWAY LTD., New Taipei (TW)

( * ) Notice: Subject to any disclaimer, the term of this patent is extended or adjusted under 35 U.S.C. 154(b) by 0 days.

(21) Appl. No.: 14/567,123

(22) Filed: Dec. 11, 2014

(65) Prior Publication Data

US 2016/0065192 A1   Mar. 3, 2016

(30) Foreign Application Priority Data

Sep. 3, 2014 (TW) .............................. 103130413 A

(51) Int. Cl.
    *H03L 7/00* (2006.01)
    *H03K 5/05* (2006.01)
    *H03K 5/26* (2006.01)

(52) U.S. Cl.
CPC ........ *H03K 5/05* (2013.01); *H03K 5/26* (2013.01); *H03L 7/00* (2013.01)

(58) Field of Classification Search
None
See application file for complete search history.

(56) References Cited

U.S. PATENT DOCUMENTS

| | | | |
|---|---|---|---|
| 6,470,458 B1 * | 10/2002 | Dreps | G06F 1/10 713/1 |
| 7,382,844 B2 * | 6/2008 | Hwang | G06F 1/10 327/141 |
| 8,692,561 B2 * | 4/2014 | Cordero | G06F 1/10 324/601 |
| 2011/0074471 A1 * | 3/2011 | Jin | H03K 17/22 327/143 |

FOREIGN PATENT DOCUMENTS

| | | |
|---|---|---|
| TW | 200903216 | 1/2009 |
| WO | 2008135305 | 11/2008 |

* cited by examiner

*Primary Examiner* — Cassandra Cox
(74) *Attorney, Agent, or Firm* — WPAT, PC; Justin King

(57) ABSTRACT

The present invention provides a method for computing compensation time for clock difference between a first chip and a second chip. The method comprises emitting, by the second chip, a pulse with a fixed pulse length to the first chip; measuring, by the first chip, a pulse length of the pulse; computing the compensation time according to the measure pulse length and the fixed pulse length; and setting the compensation time to the second chip.

12 Claims, 3 Drawing Sheets

COMPENSATION TIME COMPUTING METHOD AND DEVICE FOR CLOCK DIFFERENCE

CROSS-REFERENCE TO RELATED APPLICATIONS

This application claims the benefit of priority to Taiwan patent application Ser. No. 103130413 entitled "Compensation Time Computing Method and Device for Clock Difference", filed, Sep. 3, 2014, which is also incorporated herein by reference.

FIELD OF THE INVENTION

The present invention pertains to synchronization between multiple chips, and more particularly pertains to a method for computing a compensation time for clock difference between touch screen controller chips.

BACKGROUND OF THE INVENTION

Touch panels or screens are used more and more as the primary input electronic devices. The size of the touch panel or screen required by users becomes larger and larger, and the resolution of the touch panel or screen becomes higher and higher. As a result, quantity of the electrodes on touch panels or screens needs to be increased. Physically restricted by electric wires and pins of chip carrier, it is usually very difficult, if not impossible, to connect the electrodes to one single chip. Instead, the electrodes are usually connected to a plural of slave chips, which are further connected to one master chip by buses or exclusive electric wires.

That being said, the electric wires connecting the slave chips to the master chip are often different in length because of the physical restrictions of the electric wires. Moreover, the clock signals received by the master chip and the slave chips may not be from the same source. The clock signals transmitted to the master chip and the slave chips through the electric wires may be delayed or be skewed. As quicker touch reporting rate for the electronic devices is required, scanning time for the touch screen controller chip becomes shorter. Further, considering external electromagnetic interference, there is a need of changing the driving frequencies of the touch screen controller chip in order to avoid interference sensitive frequencies.

As a result, a mechanism is required to identify errors of dynamic pulse and to adjust the synchronization between the slave chips 130 and the master chip 120, so as to increase the accuracy of the measuring and reporting of the touch points. With the said mechanism, manufacturers of electronic devices may worry less about the physical electric wires.

SUMMARY OF THE PRESENT INVENTION

The present invention provides a method for computing a compensation time for clock difference between a first chip and a second chip. The steps of the method include: emitting, by the second chip, a pulse with a fixed pulse length to the first chip; measuring, by the first chip, a pulse length of the pulse emitted by the second chip; computing the compensation time according to the measured pulse length and the fixed pulse length; and setting the compensation time to the second chip.

The present invention provides a method for computing a compensation time for clock difference between a first chip and a second chip. The steps of the method include: emitting, by the second chip, a first pulse with a first fixed pulse length to the first chip; measuring, by the first chip, a first pulse length of the first pulse emitted by the second chip; emitting, by the second chip, a second pulse with a second fixed pulse length to the first chip; measuring, by the first chip, a second pulse length of the second pulse emitted by the second chip; computing, according to an instruction length and an instruction number of the second pulse, a difference to the measured first pulse length; adjusting a real pulse length of the second pulse according to the difference; computing the compensation time according to the adjusted real pulse length of the second pulse, which is adjusted by the instruction length and/or the instruction number of the second pulse, and the measured second pulse length; and setting the compensation time to the second chip The present invention provides a device for computing a compensation time for clock difference. The device includes a first chip; and a second chip, for emitting a pulse with a fixed pulse length to the first chip; wherein the first chip measures a pulse length of the pulse emitted by the second chip; the first chip computes the compensation time according to the measured pulse length and the fixed pulse length; and the first chip sets the compensation time to the second chip.

The present invention provides a device for computing a compensation time for clock difference. The device includes a first chip, for measuring a pulse length of the pulse emitted by a second chip, and for transmitting the measured pulse length to the second chip; and the second chip, for emitting a pulse with a fixed pulse length to the first chip; wherein the second chip computes the compensation time according to the measured pulse length and the fixed pulse length; and the second chip sets the compensation time to itself.

The present invention provides a device for computing a compensation time for clock difference. The device includes a first chip; and a second chip, for emitting a first pulse with a first fixed pulse length and then a second pulse with a second fixed pulse length to the first chip; wherein the first chip measures a first pulse length of the first pulse and then a second pulse length of the second pulse emitted by the second chip; the first chip computes, according to an instruction length and an instruction number of the second pulse, a difference to the measured first pulse length; the first chip adjusts a real pulse length of the second pulse according to the difference; the first chip computes the compensation time according to the adjusted real pulse length, which is adjusted by the instruction length and/or the instruction number of the second pulse, and the measured second pulse length; and the first chip sets the compensation time to the second chip.

The present invention provides a method for computing a compensation time for clock difference between a first chip and a second chip. The steps of the method include: measuring a pulse length of the pulse emitted by the second chip; computing the compensation time according to the measured pulse length and a fixed pulse length; and setting the compensation time to the second chip.

The present invention provides a device for computing a compensation time for clock difference. The device is configured to: measuring a pulse length of the pulse emitted by the second chip; computing the compensation time according to the measured pulse length and a fixed pulse length; and setting the compensation time to the second chip.

The present invention provides a method for computing a compensation time for clock difference between a first chip and a second chip. The steps of the method include: emitting a pulse with a fixed pulse length to the first chip; receiving a pulse length of the pulse measured by the first chip;

computing the compensation time according to the measured pulse length and the fixed pulse length; and setting the compensation time to the second chip.

The present invention provides a device for computing a compensation time for clock difference. The device is configured to: emitting a pulse with a fixed pulse length to the first chip; receiving a pulse length of the pulse measured by the first chip; computing the compensation time according to the measured pulse length and the fixed pulse length; and setting the compensation time to the second chip.

DETAILED DESCRIPTION OF THE INVENTION

It is to be understood that both the foregoing general description and the following detailed description are exemplary and explanatory only and are not restrictive of the invention, as claimed. It should be noted that, as used in the specification and the appended claims, the singular forms "a", "an" and "the" include plural referents unless the context clearly dictates otherwise. It should be noted that the figures merely for convenience of explanation and the proportional relationship is not necessarily correct.

Figure 1:
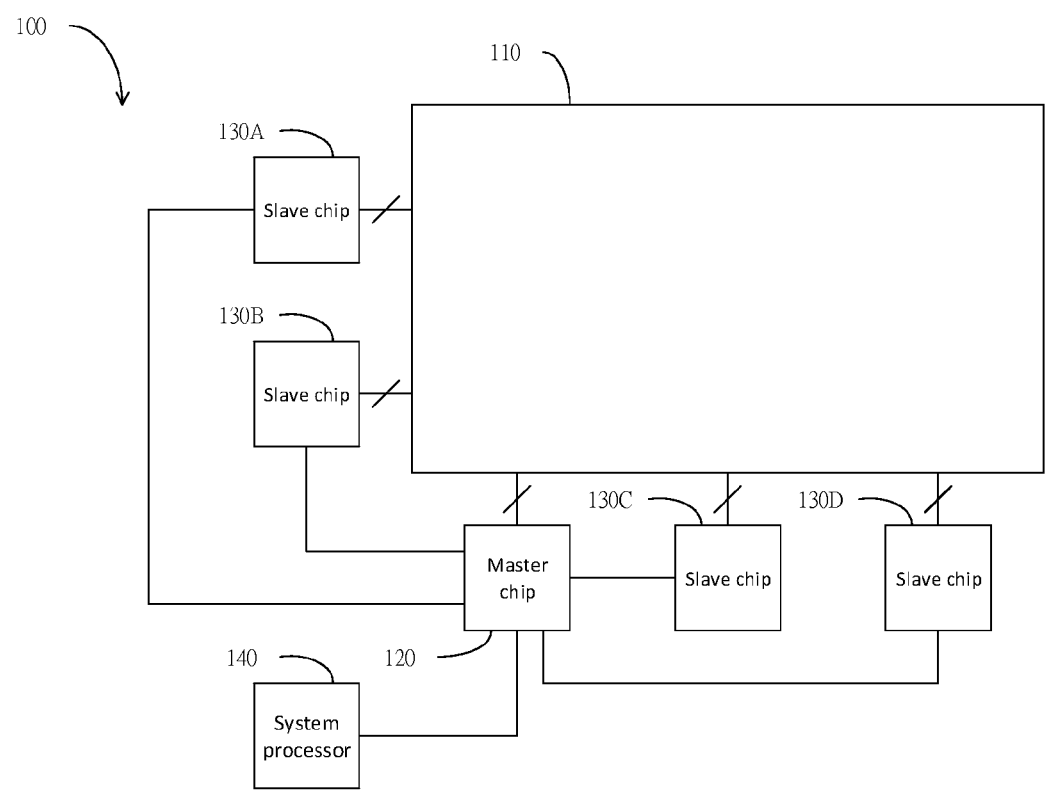
FIG. 1 is a diagram of an electronic device 100 according to an embodiment of the present invention.

Please refer to FIG. 1, which is a diagram of an electronic device 100 according to an embodiment of the present invention. The electronic device 100 includes a touch panel or screen 100, which are hereinafter referred to as the touch screen 100 in the present invention. There are a plurality of electrodes disposed on/in the touch screen 110, and the electrodes include driving electrodes, sensing electrodes, dummy electrodes, etc. The number and type of the electrodes are not limited in the present invention, as long as the electrodes are electrically connected to at least one touch screen controller chip.

The electronic device 100 includes a plurality of touch screen controller chips, and the touch screen controller chips include a master chip 120 and a plurality of slave chips 130A to 130D. The quantity of the slave chips is not limited in the present invention, but there are at least one master chip 120 and the slave chips 130A to 130D in the electronic device 100. In an embodiment, the electrodes of the touch screen 100 are electrically connected to one of the slave chip 130. In another embodiment, the electrodes of the touch screen 100 are electrically connected to the master chip 120. In other words, the electrodes are not limited to be electrically connected to the master chip 120 or the slave chip 130 in the present invention In the embodiment according to the present invention, said master chip 120 can be named first chip, and said slave chip 130 can be named second chip. It is noted that the first chip and the second chip are not limited to be used in function of the touch screen technology. In the embodiment as shown in FIG. 1, the slave chips 130A to 130D are electrically connected to the master chip 120 in direct. In another embodiment, the slave chips 130A to 130D are electrically connected to the master chip 120 by a bus. The connection between the master chip 120 and the slave chip 130 is not limited in the present invention, as long as the embodiments as follows can be performed by the master chip 120 and the slave chip 130.

As shown in FIG. 1, the mater chip 120 is electrically connected to a system processor 140 of the electronic device 100. In another embodiment, the master chip is electrically connected to the system processor 140 by intermediate circuit such as a bus or a bridge. The connection between the master chip 120 and the system processor 140 is not limited in the present invention. In another embodiment, the master chip 120 and the system processor 140 can be integrated on the same chip. The system processor 140 is used for executing an operating system to control the entire operation of the electronic device 100. The touch-related information obtained from said master chip 120 and the slave chip 130 are transmitted to the system process 140 by the master chip 120 for providing to the operating system and its applications.

In an embodiment, said master chip 120 and said slave chip 130 both include an embedded processor or a microcontroller unit (MCU) for executing instructions. For example, the MCU herein can be Intel's 8051 processor, Microchip's PIC24 microcontroller, or ARM's Cortex M series microcontrollers. The type and quantity of the MCU is not limited herein, and the master chip 120 and the slave chip 130 are not limited to be the same MCU. In other words, the instruction performed by the MCU controls the operations and external circuits of the master chip 120 and the slave chip 130.

The MCUs of the master chip 120 and the slave chip 130 are operated both with clock signals. For matching the master chip 120 and the slave chip 130 with the electrodes of the touch screen 110, the master chip 120 and the slave chip 130 are connected to the electrodes by electric wires with different lengths, resulting in unsynchronized clocks between the master chip 120 and the slave chip 130. Because of un-matching chips, the received clocks may not be the same. Furthermore, the clocks between each of the slave chip 130 and the master chip 120 are different. The present invention provides a mechanism for correcting the clock difference between the slave chip 130 and the master chip 120.

Figure 2:
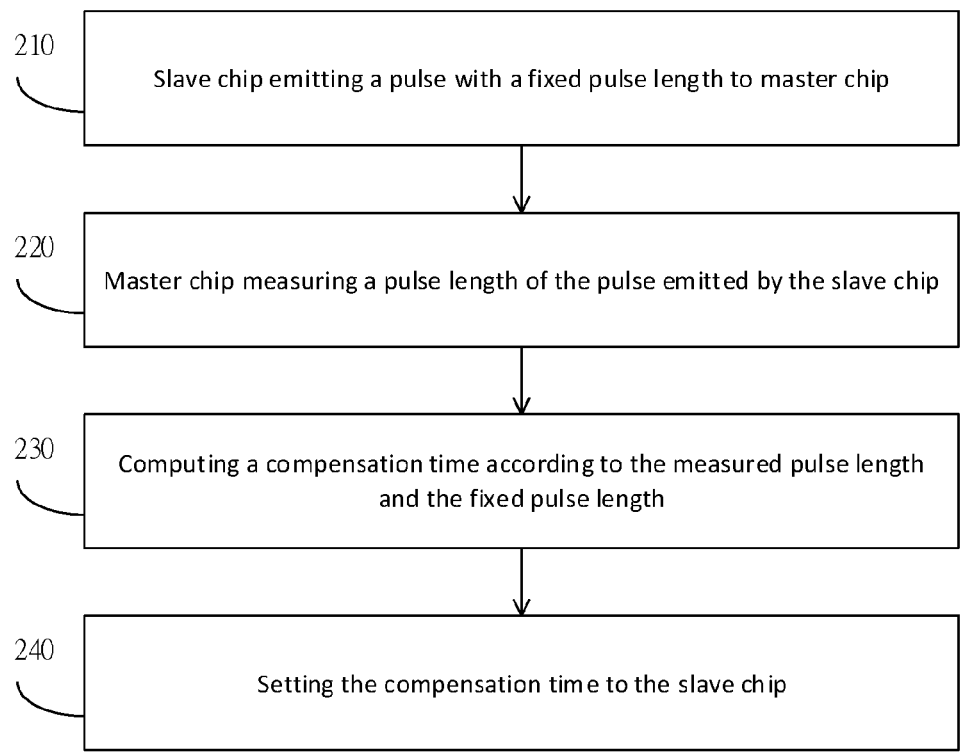
FIG. 2 is a flow chart of a method for computing a compensation time for clock difference according to an embodiment of the present invention.

Please refer to FIG. 2, which is a flow chart of a method for computing a compensation time for clock difference according to an embodiment of the present invention. Before performing said method, hand shaking is performed between the master chip 120 and the slave chip 130 to make the master chip 120 and the slave chip 130 both ready for measurement and computation of the compensation time. In an embodiment, hand shaking can be initiated by the master chip 120. In another embodiment, hand shaking can be initiated by the slave chip 130. Hand shaking can be initiated by whichever chip, It is not limited either to the timing of implementing the method. Steps of the method are as follows.

Step 210: The slave chip 130 emits a pulse with a fixed pulse length to the master chip 120. In an embodiment, said fixed pulse length is related to the clock of the slave chip 130. For example, the fixed pulse length of the pulse is C times the clock of the single slave chip 130, wherein C is not limited to a positive integer.

Step 220: The master chip 120 measures a pulse length of the pulse emitted by the slave chip 130. For example, the measured pulse length Tm, is assumed to be Cm times the clock t of the single master chip 120, wherein Cm is not limited to a positive integer. Due to the different clocks of the master chip and the slave chip, C is not necessarily equal to Cm.

Step 230: The compensation time is computed according to the measured pulse length and the fixed pulse length. The compensation time is the difference between the measured time and an idol time. The idol time is C times the clock t of the master chip 120, and compensation time is: $C*t-Cm*t$, or $(C-Cm)*t$.

Step 240: The afore-said compensation time is set to the slave chip 130.

In an embodiment, step 230 can be performed by the master chip 120. After the compensation time is computed by the master chip 120, go to step 240. In another embodiment, there are plural slave chips 130 in the electronic device 100 as shown in FIG. 1. The compensation time can be computed by each of the slave chips 130, wherein the measured pulse length is transmitted from the master chip 120 to the slave chip 130.

Figure 3:
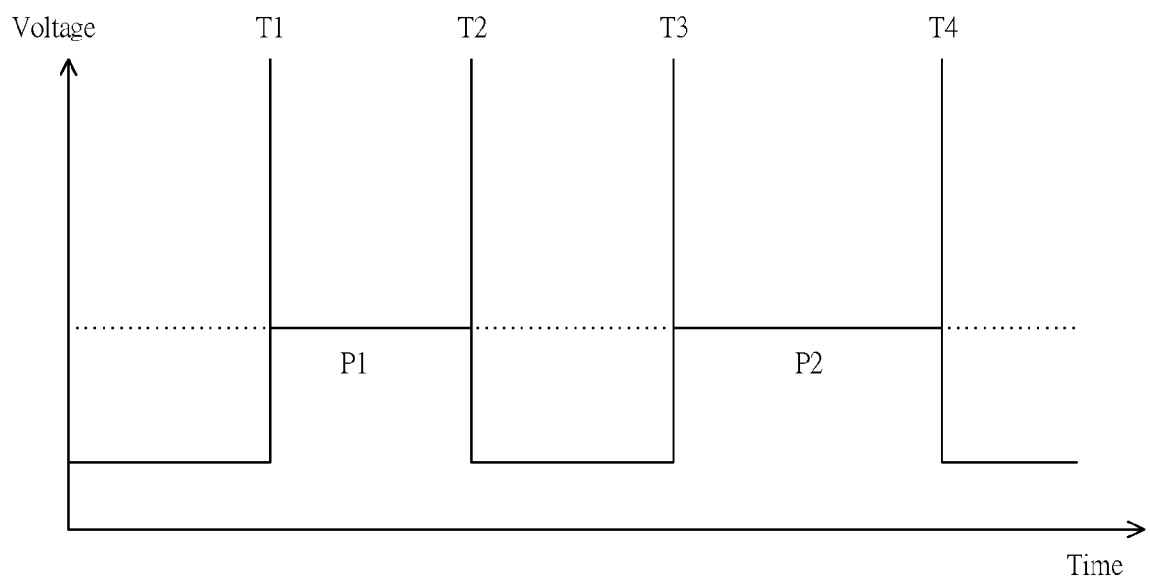
FIG. 3 is a waveform diagram of the pulse according to an embodiment of the present invention.

When performing the method as shown in FIG. 2, measurement errors may happen especially when performing step 220 of measuring the pulse length of the pulse. Please refer to FIG. 3, which is a waveform diagram of the pulse according to an embodiment of the present invention. The waveform as shown in FIG. 3 represents the signal, including two pulses P1 and P2, transmitted to the master chip 120 by the slave chip 130. Though voltages of the pulses P1 and P2 are much higher in the waveform as shown in FIG. 3, a person of ordinary skill in the art would understand that voltages of the pulses P1 and P2 can be much lower in the other embodiments.

For the master chip 120, the measured pulse length P1_C is the difference between time points T1 and T2, and the measured pulse length P2_C is the difference between time points T3 and T4. As just mentioned, measurement errors may happen when measuring the pulse length of the pulse. Therefore, the formula of the measured pulse length P1_C is: $T2 \pm T1 \pm \Delta t1$, wherein t1 is a probable measurement error value. Similarly, the formula of the measured pulse length P2_C is: $T4-T3 \pm \Delta t2$, wherein t2 is a probable measurement error value.

For the slave chip 130, the pulse length of the pulse P2 can be a multiple of the clock of the pulse P2. From another perspective, an instruction of the fixed pulse length of the pulse is performed by the MCU of the slave chip 130, and the fixed pulse length is a fixed multiple of the clock of the pulse. For example, an instruction of Arithmetic and Logic Operation is performed by the MCU, and each instruction takes one clock. Therefore, the voltage of the pulse P2 is raised by the MCU to perform K instruction numbers, and then the voltage of the pulse P2 comes back. The pulse length of the pulse P2 is $K*DT$, wherein DT is a fixed instruction length.

Next, a difference A between the pulse length of the pulse P2 and the measured pulse length P1_C is computed. If the difference is represented by the instruction length, the difference is $A=K*DT-P1\_C$. Because timer steps are performed with three instructions when the pulse P2 is emitted, in order to obtain a real pulse length, timer steps associated with the three instructions needs to be subtracted from the difference A before the subtracted difference A is subtracted from the pulse length of the pulse P2, which is represented: P2=P2-A %3. If the timer step is performed with four instructions, the real pulse length of the pulse P2 is represented: P2=P2-A %4. If the instruction number of the pulse P2 is K, the compensation time C of each instruction is $(P2-P2\_C+(K/2))/K$.

Figure 4:
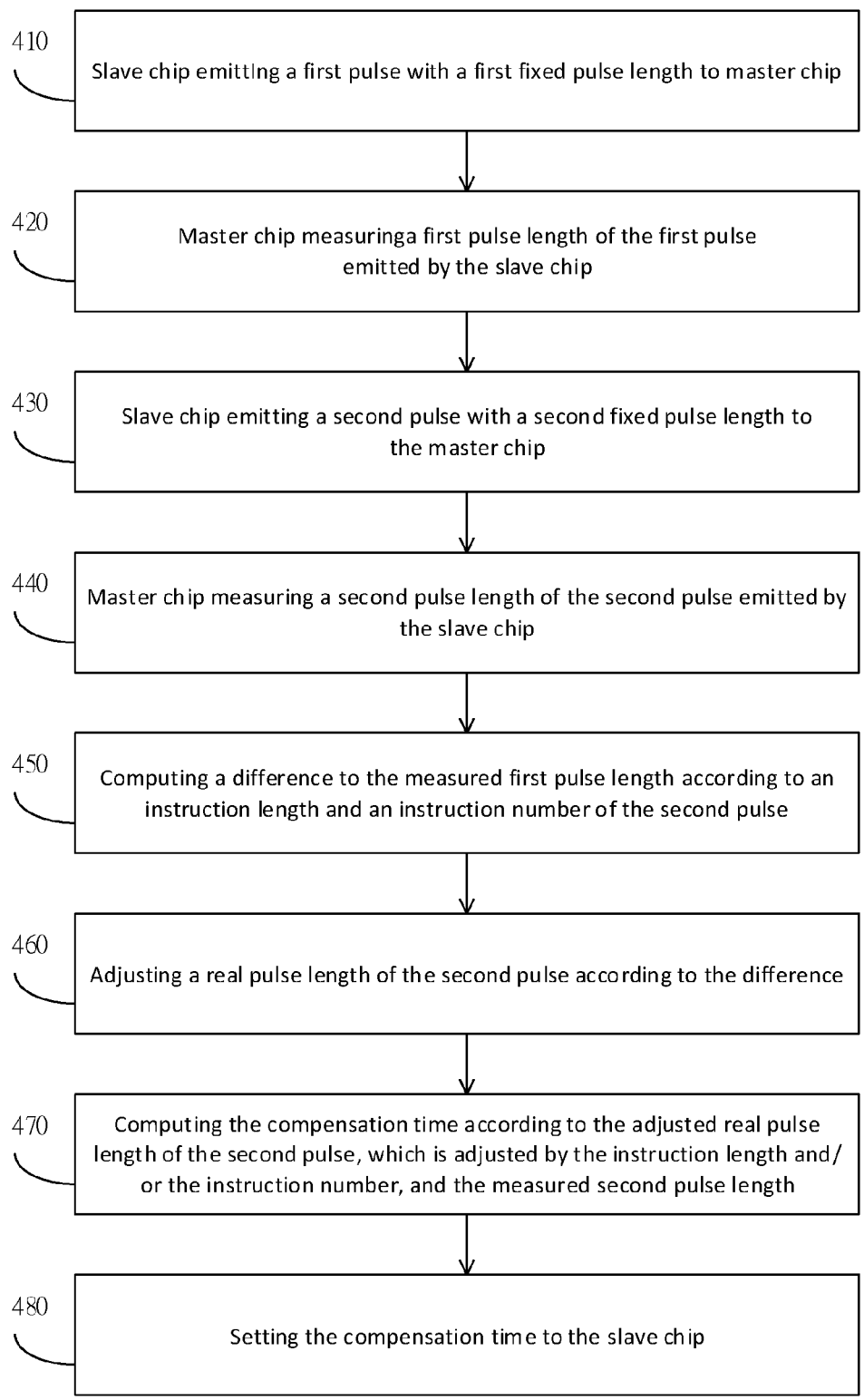
FIG. 4 is a flow chart of a method for computing a compensation time for clock difference according to another embodiment of the present invention.

Please refer to FIG. 4, which is a flow chart of a method for computing a compensation time for clock difference according to another embodiment of the present invention. The flow chart as shown in FIG. 4 can be explained with reference to FIGS. 2 and 3.

Step 410: The slave chip emits a first pulse (P1) with a first fixed pulse length to the master chip.

Step 420: The master chip measures a first pulse length (P1_C) of the first pulse emitted by the slave chip.

Step 430: The slave chip emits a second pulse (P2) with a second fixed pulse length to the master chip.

Step 440: The master chip measures a second pulse length (P2_C) of the second pulse emitted by the slave chip.

Step 450: According to an instruction length (DT) and an instruction number (K) of the second pulse, a difference (A) to the measured first pulse length (P1_C) is computed. For instance, the formula of the difference is: $A=K*DT-P1\_C$.

Step 460: A real pulse length of the second pulse is adjusted according to the afore-said difference. For instance, the formula of the real pulse length of the second pulse is: P2=P2-A % N, wherein N is the instruction number required by timer step. Furthermore, the step 460 further includes adjusting the real pulse length of the second pulse according to the timer steps associated with the instruction number.

Step 470: The compensation time (C) is computed according to the adjusted real pulse length (P2) of the second pulse, the instruction number (K) of the second pulse and the measured second pulse length (P2_C). For instance, the formula of the compensation time (C) is: $(P2-P2\_C+(K/2))/K$.

Step 480: The compensation time is set to the slave chip 130.

Above all, the present invention provides at least two methods for computing the compensation time for clock difference. It solves the problem of the different or/and unsynchronized clocks of the master chip 120 and the slave chip 130.

The above embodiments are only used to illustrate the principles of the present invention, and they should not be construed as to limit to the present invention in any way. The above embodiments can may be modified by those with ordinary skill in the art without departing from the scope of the present invention as defined in the following appended claims.

What is claimed is:

1. A method for computing a compensation time for clock difference between a first chip and a second chip, the steps of the method comprising:
   emitting, by the second chip, a pulse with a fixed pulse length to the first chip;
   measuring, by the first chip, a pulse length of the pulse emitted by the second chip;
   computing the compensation time according to the measured pulse length and the fixed pulse length; and
   setting the compensation time to the second chip.

2. The method according to claim 1, wherein the first chip is a master chip of touch screen controller chip, and the second chip is a slave chip of the touch screen controller chip.

3. The method according to claim 1, wherein the step of computing the compensation time is performed by the first chip.

4. The method according to claim 1, wherein the step of computing the compensation time is performed by the second chip, and the measured pulse length is transmitted from the first chip to the second chip.

5. The method according to claim 1, wherein the fixed pulse length of the pulse is a second multiple of a second clock of the second chip.

6. The method according to claim 5, wherein the fixed pulse length of the pulse is a first multiple of a first clock of the first chip, and the compensation time is a product of the first clock and a difference between the first multiple and the second multiple.

7. A method for computing a compensation time for clock difference between a first chip and a second chip, the steps of the method comprising:
- emitting, by the second chip, a first pulse with a first fixed pulse length to the first chip;
- measuring, by the first chip, a first pulse length of the first pulse emitted by the second chip;
- emitting, by the second chip, a second pulse with a second fixed pulse length to the first chip;
- measuring, by the first chip, a second pulse length of the second pulse emitted by the second chip;
- computing, according to an instruction length and an instruction number of the second pulse, a difference to the measured first pulse length;
- adjusting a real pulse length of the second pulse according to the difference;
- computing the compensation time according to the adjusted real pulse length of the second pulse, which is adjusted by the instruction length and/or the instruction number of the second pulse, and the measured second pulse length; and
- setting the compensation time to the second chip.

8. The method according to claim 7, wherein the first chip is a master chip of touch screen controller chip, and the second chip is a slave chip of the touch screen controller chip.

9. The method according to claim 7, further comprising: adjusting the real pulse length of the second pulse according to the instruction number.

10. A device for computing a compensation time for clock difference, comprising:
- a first chip; and,
- a second chip, for emitting a first pulse enduring a first fixed pulse length and then a second pulse enduring a second fixed pulse length to the first chip;
- wherein the first chip measures a first pulse length of the first pulse and then a second pulse length of the second pulse emitted by the second chip;
- the first chip computes, according to an instruction length and an instruction number of the second pulse, a difference to the measured first pulse length;
- the first chip adjusts a real pulse length of the second pulse according to the difference;
- the first chip computes the compensation time according to the adjusted real pulse length, which is adjusted by the instruction length and/or the instruction number of the second pulse, and the measured second pulse length; and
- the first chip sets the compensation time to the second chip.

11. The device according to claim 10, wherein the first chip is a master chip of touch screen controller chip, and the second chip is a slave chip of the touch screen controller chip.

12. The device according to claim 10, further comprising: adjusting the real pulse length of the second pulse according to the instruction number.

* * * * *